(12) United States Patent
Lebby et al.

(10) Patent No.: US 10,431,729 B2
(45) Date of Patent: Oct. 1, 2019

(54) JOSEPHSON JUNCTION USING MOLECULAR BEAM EPITAXY

(71) Applicant: Ambature, Inc., Scottsdale, AZ (US)

(72) Inventors: Michael S. Lebby, Apache Junction, AZ (US); Davis H. Hartmann, Scottsdale, AZ (US)

(73) Assignee: Ambature, Inc., Scottsdale, AZ (US)

( * ) Notice: Subject to any disclaimer, the term of this patent is extended or adjusted under 35 U.S.C. 154(b) by 0 days.

(21) Appl. No.: 15/644,753

(22) Filed: Jul. 8, 2017

(65) Prior Publication Data

US 2018/0013053 A1  Jan. 11, 2018

Related U.S. Application Data

(60) Provisional application No. 62/360,920, filed on Jul. 11, 2016.

(51) Int. Cl.
  *H01L 39/24* (2006.01)
  *H01L 39/02* (2006.01)
  *H01L 39/22* (2006.01)

(52) U.S. Cl.
  CPC ........ *H01L 39/2496* (2013.01); *H01L 39/025* (2013.01); *H01L 39/225* (2013.01); *H01L 39/2432* (2013.01); *H01L 39/2461* (2013.01)

(58) Field of Classification Search
  CPC .......................... H01L 39/025; H01L 39/2496
  See application file for complete search history.

(56) References Cited

U.S. PATENT DOCUMENTS

| | | | | |
|---|---|---|---|---|
| 5,696,392 A | * | 12/1997 | Char | H01L 27/18 257/190 |
| 5,739,086 A | * | 4/1998 | Goyal | C21D 8/12 505/473 |
| 5,750,474 A | * | 5/1998 | Sung | H01L 39/223 427/62 |
| 6,476,413 B1 | * | 11/2002 | Jia | H01L 39/225 257/31 |
| 6,663,989 B2 | * | 12/2003 | Lee | C30B 23/02 257/E21.272 |
| 2004/0077504 A1 | * | 4/2004 | Adachi | H01L 39/225 505/234 |
| 2007/0157873 A1 | * | 7/2007 | Hauptmann | B82Y 20/00 117/87 |
| 2012/0252676 A1 | * | 10/2012 | Gilbert | H01L 39/2464 505/150 |

* cited by examiner

*Primary Examiner* — Paul A Wartalowicz
(74) *Attorney, Agent, or Firm* — Toering Patents PLLC

(57) ABSTRACT

According to various implementations of the invention, a vertical Josephson Junction device may be realized using molecular beam epitaxy (MBE) growth of YBCO and PBCO epitaxial layers in an a-axis crystal orientation. Various implementations of the invention provide improved vertical JJ devices using SiC or LSGO substrates; GaN, AlN, or MgO buffer layers; YBCO or LSGO template layers; YBCO conductive layers and various combinations of barrier layers that include PBCO, NBCO, and DBCO. Such JJ devices are simple to fabricate with wet and dry etching, and allow for superior current flow across the barrier layers.

6 Claims, 5 Drawing Sheets

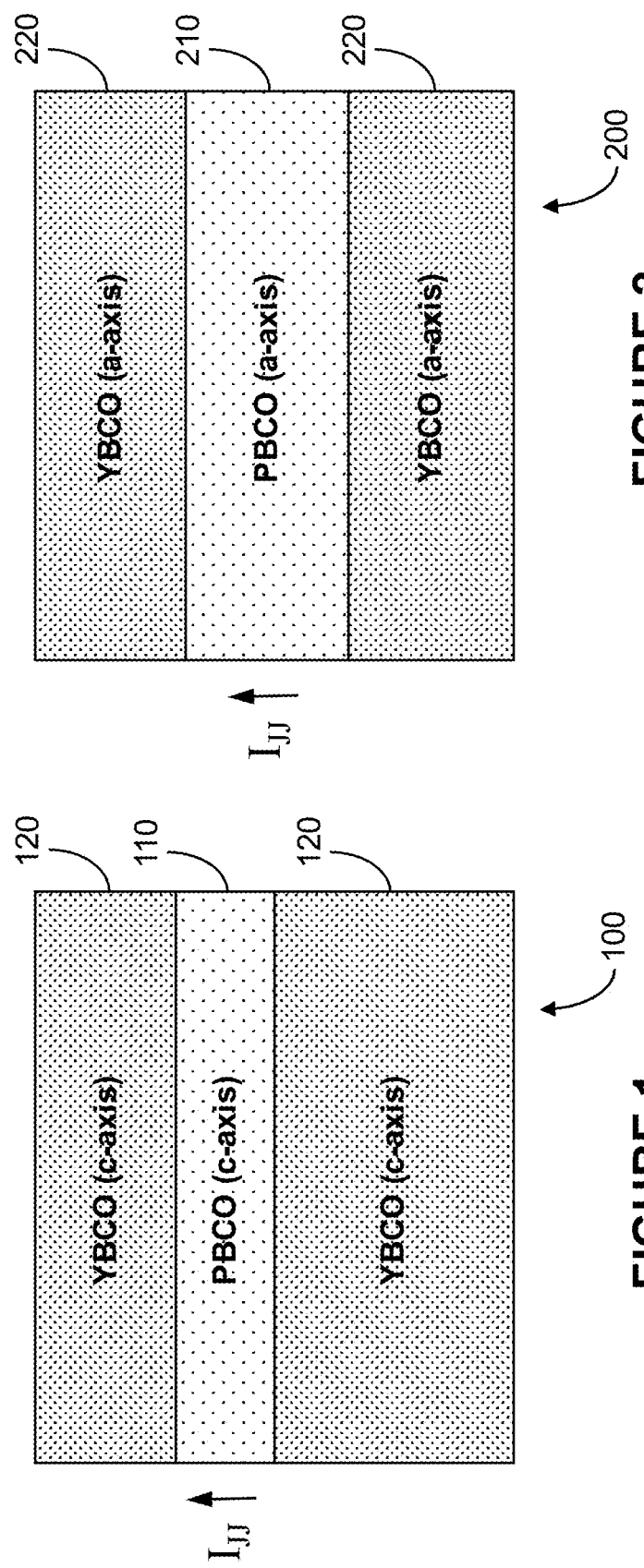

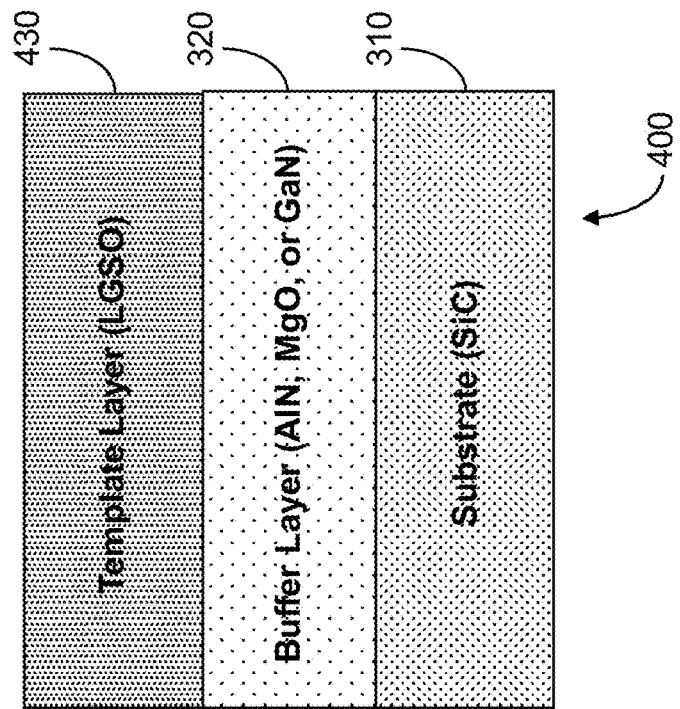
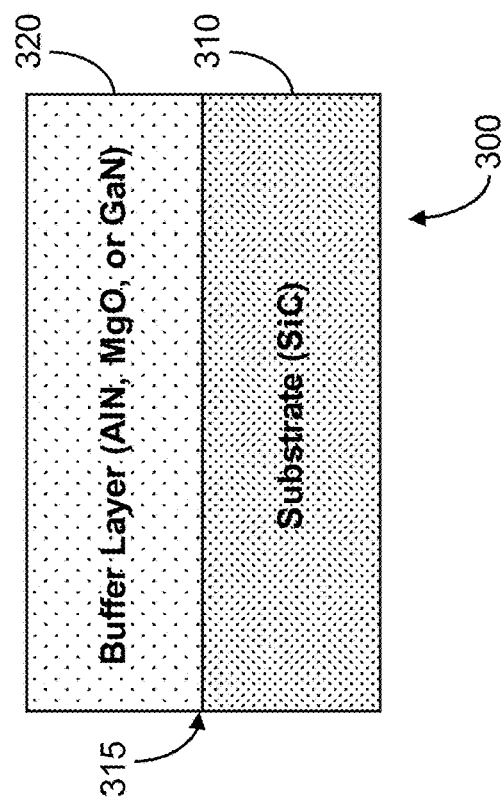
FIGURE 4
FIGURE 3

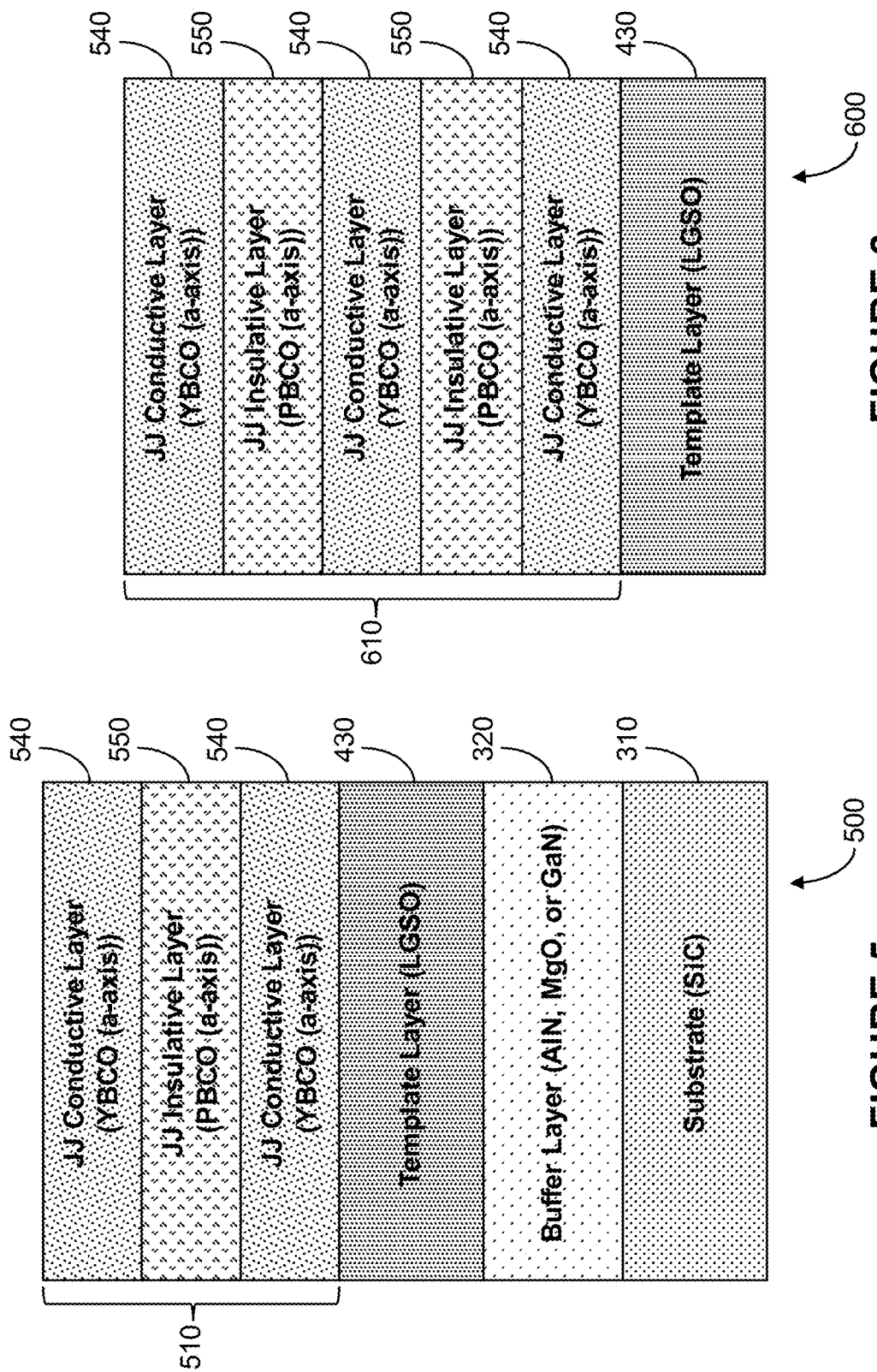

JOSEPHSON JUNCTION USING MOLECULAR BEAM EPITAXY

CROSS-REFERENCE TO RELATED APPLICATIONS

This Application claims priority to U.S. Provisional Patent Application No. 62/360,920, entitled "Improved Semiconductor Device using Molecular Beam Epitaxy," which was filed on Jul. 11, 2016. The foregoing application is incorporated herein by reference in its entirety.

FIELD OF THE INVENTION

The invention is generally related to high temperature superconductors, and more specifically, to techniques for manufacturing improved YBCO-based vertical Josephson Junctions (JJs) using molecular beam epitaxy (MBE).

BACKGROUND OF THE INVENTION

There are many conventional techniques to produce YBCO materials, the most common of which is pulsed laser deposition. This technique has been the leading commercial technique to grow YBCO films in a c-axis crystalline orientation. These YBCO films have successfully produced c-axis Josephson Junctions (JJs) that have been utilized to produce superconducting wires, sensors, and other applications.

Improved techniques for producing YBCO materials, including JJs, are needed.

SUMMARY OF THE INVENTION

According to various implementations of the invention, a-axis thin film YBCO layers may be deposited using a technique called molecular beam epitaxy (MBE). MBE is a well-characterized crystal growth technique for improved thin films in the semiconductor domain. According to various implementations of the invention, MBE may be used to grow very high quality YBCO (and related) thin films in an a-axis crystal orientation. Various implementations of the invention provide higher crystalline quality, higher accuracy in film thickness, higher a-axis orientation, as well as single crystal growth with lattice matching or strained lattice matching with YBCO-related thin film materials.

Various implementations of the invention utilize various perovskite materials including, but not limited to, $YBa_2Cu_3O_{7-x}$, $PrBa_2Cu_3O_{7-x}$, $DyBa_2Cu_3O_{7-x}$, $NdBa_2Cu_3O_{7-x}$, and other perovskites. Such materials are commonly and collectively expressed as $XBa_2Cu_3O_{7-x}$ (XBCO) where X can be elements such as Y, Pr, Dy, Nd etc., as would be appreciated. For purposes of this description, these materials are more commonly referred to as simply YBCO, PBCO, DBCO, NBCO, etc., as would be appreciated.

According to various implementations of the invention, the substrate may be placed inside an MBE reactor and exposed to various metallic sources at temperature. A-axis films may be grown onto the substrate using a RHEED measuring tool to monitor and maintain good crystallographic quality. Thickness sensors may be used to accurately measure the height (e.g., thickness) of the a-axis films, and temperature sensors may be used to make sure the a-axis crystal is grown with correct specifications, and robustness for repeatability.

In various implementations of the invention, various buffer layers may be grown to allow the YBCO and/or related thin films to be lattice matched and grown with high quality onto the substrates. In some implementations, buffer layers of aluminum nitride (AlN) and/or gallium nitride (GaN) may be used to grow onto SiC substrates to allow the growth of LSGO to become a base layer for JJ device epitaxial growth (alternating and various composition of layers of YBCO and PBCO).

According to various implementations of the invention, once all of the thin film layers are deposited using the MBE reactor, the wafer may be removed and JJ devices may be subsequently fabricated using a clean room facility with standard tooling (dry etch, wet etch, photolithography, metallization, etc.) as would be appreciated.

BRIEF DESCRIPTION OF THE DRAWINGS

FIG. 1 illustrates a conventional c-axis orientation epitaxial structure of a Josephson Junction.

FIG. 2 illustrates an a-axis orientation epitaxial structure of a Josephson Junction according to various implementations of the invention.

FIG. 3 illustrates an epitaxial layer that may be grown using MBE according to various implementations of the invention, namely, a buffer layer onto a substrate.

FIG. 4 illustrates an epitaxial layer that may be grown by MBE according to various implementations of the invention, namely a template layer onto the buffer layer.

FIG. 5 illustrates epitaxial layers that may be grown by MBE a-axis orientation according to various implementations of the invention, namely layers of YBCO and PBCO that form a JJ device onto the template layer.

FIG. 6 illustrates epitaxial layers that may be grown by MBE a-axis orientation according to various implementations of the invention, namely multiple alternating superlattice layers of YBCO and PBCO that form a JJ device onto the template layer.

DETAILED DESCRIPTION

Figure 8:
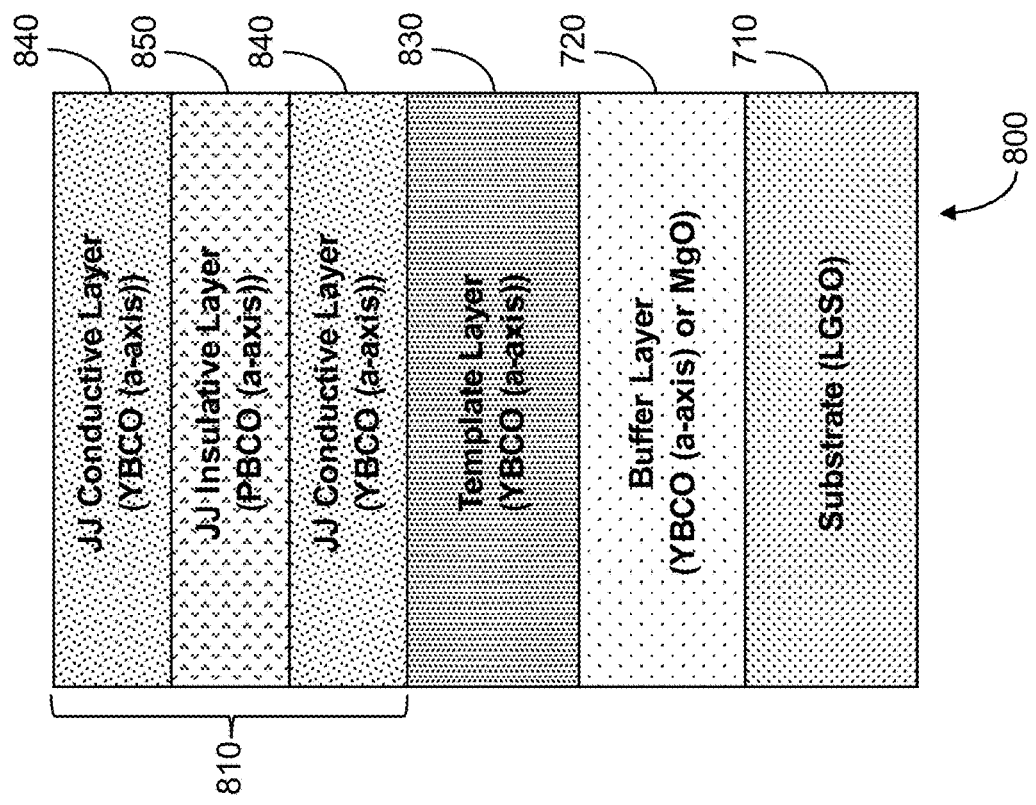
FIG. 8 illustrates epitaxial layers that may be grown by MBE a-axis orientation according to various implementations of the invention, namely layers of YBCO and PBCO that form a JJ device onto a YBCO template layer that in turn was grown on top of the buffer layer.

Various implementations of the invention utilize YBCO and related films grown in an a-axis crystal orientation. While a-axis orientation growth of YBCO has been demonstrated previously, a-axis YBCO films have not been used to commercially develop a vertical Josephson Junction (JJ) as a result of high cost, low quality, poor crystal growth, poor film thickness, poor composition, and difficult control typically associated with growth of such a-axis YBCO films.

Furthermore, pulsed laser deposition thin films of YBCO have experienced various manufacturing issues, such as the material being brittle and prone to excessive degradation even in the c-axis orientation, which also has experienced limited commercial success. These conditions are significantly worse for a-axis crystal orientations of YBCO films.

As a result, pulsed laser deposition as a technique to deposit thin film YBCO materials has suffered significant set-backs.

In spite of these disadvantages, YBCO has great potential to industries that rely on magnetic fields (shields, magnets, high current products, bearings, etc.) with a vertical JJ device structure. For example, a longer coherence length in a-axis YBCO as well as a higher current density makes a-axis YBCO desirable over c-axis YBCO for vertical JJ devices. Various implementations of the invention provide a cost effective process to grow thin film YBCO a-axis orientation materials that are not only low cost, and high quality, but also can perform better than conventional c-axis YBCO materials.

According to various implementations of the invention, vertical JJ devices may be realized using a-axis thin film deposition of YBCO and PBCO layers. These YBCO and PBCO layers are deposited using a technique called molecular beam epitaxy (MBE). MBE is a well characterized crystal growth technique for improved thin films in the semiconductor domain. Various implementations of the invention use MBE to grow very high quality YBCO thin films (and related films such as PBCO, DBCO, NBCO, etc.) in an a-axis crystal orientation.

Materials such as PBCO are considered barrier layers as they typically separate the YBCO layers in a vertical JJ device structure. MBE allows for higher crystalline quality, higher accuracy in film thickness, higher a-axis orientation, as well as single crystal growth with lattice matching or strained lattice matching with YBCO-related thin film materials. MBE also allows the a-axis films to circumvent the oxygen disorder that has typically prevented previous attempts to grow such films using pulse laser deposition from being successful.

According to various implementations of the invention, these MBE-grown a-axis films may be grown onto various types of substrates: 1) the first being $SrLaGaO_3$[100] (commonly referred to as LSGO); 2) the second being strontium titanate (STO); and 3) the third being silicon carbide (SiC) substrates. There are a number of other substrates that may be utilized to support MBE-grown a-axis films, including, but not limited to: Silicon (Si), Sapphire ($Al_2O_3$), and Magnesium Oxide (MgO). While LSGO may not be available in large format wafer sizes, SiC, Si, Sapphire, MgO and STO all are available in larger format wafer sizes of 50 mm or more. In some implementations of the invention, the substrates are at least 100 mm in size, or in some implementations, 150 mm, so that the completed a-axis films that are grown onto the substrates may be fabricated in a standard semiconductor fabrication facility.

In some implementations of the invention, the substrates may be grown in the [100] crystal orientation; in some implementations of the invention, the substrates may be grown in the [111] crystal orientation, the [110] crystal orientation, or other orientations as would be appreciated.

In some implementations of the invention, the substrate is placed inside an MBE reactor and exposed to various metallic sources at temperature. In some implementations of the invention, a-axis films may be grown onto the substrate using a RHEED measuring tool to monitor and maintain good crystallographic quality. In some implementations of the invention, thickness sensors may be used to accurately measure a height (i.e., thickness) of the a-axis films. In some implementations of the invention, temperature sensors may be used to make sure the a-axis crystal is grown with correct specifications, and robustness for repeatability.

Various buffer layers may be grown to allow the YBCO and related thin films to be lattice matched and grown with high quality onto the substrates. In some implementations of the invention, buffer layers of aluminum nitride (AlN) and/or gallium nitride (GaN) may be used to grow onto SiC substrates to allow the growth of LSGO to become a base layer for JJ device epitaxial growth (alternating and various composition of layers of YBCO and PBCO).

Once all of the thin film layers are deposited using the MBE reactor, the wafer is removed, and JJ devices may be fabricated using a clean room facility with standard tooling (dry etch, wet etch, photolithography, metallization, etc.) as would be appreciated.

Vertical JJ structures using a-axis crystal orientation may be realized using a number of different barrier layers that may be placed in between conductive YBCO layers. According to various implementations of the invention, PCBO, NBCO, and DBCO may each function as a barrier layer. In some implementations of the invention, more than one barrier layer may be used in between conductive YBCO layers. In some implementations of the invention, a transition from conductive YBCO layer to barrier layer may be a complex layer structure comprising a number of thinner interface layers, each comprising one or more of the barrier layer materials.

FIG. 1 illustrates a conventional c-axis orientation epitaxial structure 100 of a vertical JJ device. In this orientation, current flow, $I_{jj}$, between conductive layers 120 and across a barrier layer 110 is poor in the vertical direction. Furthermore, as PLD is used as the growth technique for these devices, the height (i.e., thickness) of the various layers 110, 120 is extremely inaccurate. This is illustrated in FIG. 1 by the differing thicknesses of layers 110, 120. As a result, such conventional processes are not sufficiently accurate to design and develop commercial JJ devices, particularly with barrier layers 110 having thicknesses on the order of tens of nanometers.

As would be appreciated, typical current flow in the c-axis films is contrary to the operation of the vertical JJ device, which requires current flow across barrier layer 110. As a result, such devices demonstrate poor performance irrespective of the thickness and quality of conductive layers 120 or barrier layer 110.

FIG. 2 illustrates an a-axis orientation epitaxial structure 200 of a vertical JJ device according to various implementations of the invention. Various implementations of the invention provide superior current flow between conductive layers 220 and across a barrier layer 210. Also, due to the growth of structure 200 using MBE, thicknesses of the respective layers 210, 220 are more tightly controlled resulting in higher performance operation. In some implementations of the invention, a thickness of the respective films are typically 100 nanometers; however, the thicknesses may range from 10 nanometers to over 1000 nanometers. In some implementations of the invention, a quality of the films is single crystal (as may be tested/determined by x-ray diffraction); in some implementations of the invention, the quality of the films is nearly single crystal. Vertical JJ devices may be readily fabricated using standard fabrication plants in the semiconductor business as would be appreciated.

FIG. 3 illustrates an epitaxial layer 300 that may be grown using MBE according to various implementations of the invention, namely, a buffer layer 320 onto a substrate 310. As illustrated in FIG. 3, substrate 310 may be SiC according to various implementations of the invention. One advantage of using SiC for substrate 310 is that the material is available in large format wafers, which makes the fabrication of the wafer simpler and more cost effective.

As also illustrated in FIG. 3, buffer layer 320 may be AlN, MgO, or GaN according to various implementations of the invention. As would be appreciated, in some implementations of the invention, buffer layer 320 may be any other material that can be epitaxially lattice matched to SiC. In some implementations of the invention, an interface 315 between substrate layer 310 and buffer layer 320 may be clean and abrupt. In some implementations of the invention, interface 315 may be graded between buffer layer 320 and substrate layer 310 as would be appreciated. For example, there might be interface layers that would include compounds of both substrate layer 310 as well as buffer layer 320. In some implementations of the invention, a thickness of buffer layer 320 may well approach a few 100 nanometers. In some implementations of the invention, a thickness of buffer layer 320 may reach a few 1000 nanometers. Buffer layer 320 may also be a combination of epitaxial layers of related compounds. Examples would be AlN interspaced with layers of AlGaN, InGaN, or InAlGaN.

FIG. 4 illustrates an epitaxial layer 400 that may be grown by MBE according to various implementations of the invention, namely a template layer 430 onto buffer layer 320. As illustrated in FIG. 4, template layer 430 may be LSGO that is grown by MBE onto a AlN buffer layer 320. In this case, the LSGO acts as a template that sets up the correct crystal orientation for a-axis YBCO. In some implementations of the invention, a thickness of template layer 430 may be 10 s of nanometers. Template layer 430 may be grown onto various buffer layer materials that include GaN, AlN, MgO or other materials as would be appreciated. The crystal lattice between template layer 430 and buffer layer 320 may be single crystal, strained single crystal, polycrystalline, and even relaxed. The purpose of template layer 430 is to be able to set the crystal orientation of the vertical JJ to be a-axis.

FIG. 5 illustrates epitaxial layers 500 that may be grown by MBE a-axis orientation according to various implementations of the invention, namely conductive layers 540 and barrier layer 550 that form a JJ device 510 on template layer 430. FIG. 5 illustrates a simple PBCO barrier layer 550 sandwiched between two conductive YBCO layers 540.

In some implementations of the invention, a thickness of barrier layer 550 is between 1 and 1000 nanometers. In some implementations of the invention, a thickness of barrier layer 550 is on the order of 10 s of nanometers (i.e., 10 nm to 100 nm). In some implementations of the invention, a thickness of conductive layer 550 is between 1 and 1000 nanometers. In some implementations of the invention, a thickness of barrier layer 550 is on the order of 10 s of nanometers (i.e., 10 nm to 100 nm). In some implementations of the invention, barrier layer 550 is thicker that conductive layer 540. In some implementations of the invention, conductive layer 540 is thicker that barrier layer 550. In some implementations of the invention, each conductive layer 540 has the same thickness. In some implementations of the invention, each conductive layer 540 has a different thickness.

As illustrated in FIG. 6, other superlattice formations of YBCO and PBCO may also be grown where a number of conductive layers 540 and barrier layers 550 may increase depending on a design of a vertical JJ device 610. (In FIG. 6, a buffer layer and a substrate layer are not illustrated for purposes of convenience.) In some implementations of the invention, the thickness may be 100 s of nanometers.

In some implementations as illustrated in FIG. 6, more than one barrier layer 550 may be used in between conductive YBCO layers 540 similar to barrier layers that are used in multi-quantum wells. In this case, barrier layers are inter-spaced between, above and below conductive layer 540 in a superlattice format. In some implementations of the invention, a transition from conductive YBCO layer 540 to barrier layer 550 may be part of a more complex layer structure where a number of thinner interface layers comprise one or more of the barrier layer materials. These interface layers act as a simple transition from conductive layer 540 to barrier layer 550 (and back) through changing of material composition. Interface layers may be grown by simply turning off one metal, and turning on another metal. The transition layer may also be composed of a number of layers that not only allow material composition change but doping, temperature, charge distribution, strained lattice effects, stressed lattice effects, lattice mismatch effects, and bandgap engineering as part of the overall interface design between conductive and insulative layers.

Figure 7:
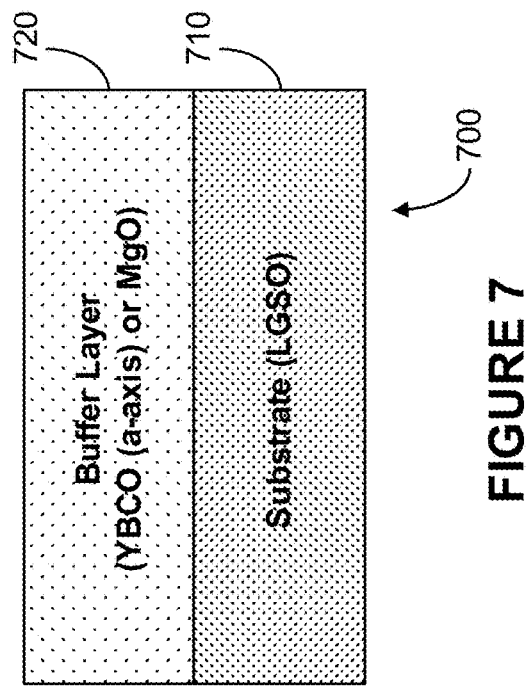
FIG. 7 illustrates an epitaxial layer that may be grown using MBE according to various implementations of the invention, namely, a buffer layer onto a substrate.

FIG. 7 illustrates an epitaxial layer 700 that may be grown using MBE according to various implementations of the invention, namely, a buffer layer 720 onto a substrate 710. As illustrated in FIG. 7, substrate 710 may be an LSGO substrate in various implementations of the invention. As also illustrated in FIG. 7, buffer layer 720 may be a YBCO or MgO buffer layer. In these implementations, conductive YBCO layers and barrier PBCO layers (collectively, not otherwise illustrated in FIG. 7) that form the vertical JJ device may be grown on top of buffer layer 720. One important difference here is that LSGO substrates 710 do not come in large format wafers, and thus may limit commercial development. Nonetheless, use of LSGO substrates 710 may be desirable as they provide a vehicle for high quality a-axis YBCO films using MBE.

FIG. 8 illustrates epitaxial layers 800 that may be grown by MBE a-axis orientation according to various implementations of the invention, namely conductive layers 840 of YBCO and a barrier layer 850 of PBCO that form a JJ device 810 onto a YBCO template layer 830 that in turn was grown on top of buffer layer 720. In some implementations of the invention, vertical JJ device 810 may be formed on an LSGO substrate 710 with buffer layers 720 of YBCO or MgO, and template layer 830 of YBCO. In these implementations, YBCO template layer 830 promotes a-axis growth of vertical conductive YBCO layer 840 and barrier PBCO layers 850 for vertical JJ device 810.

Figure 9:
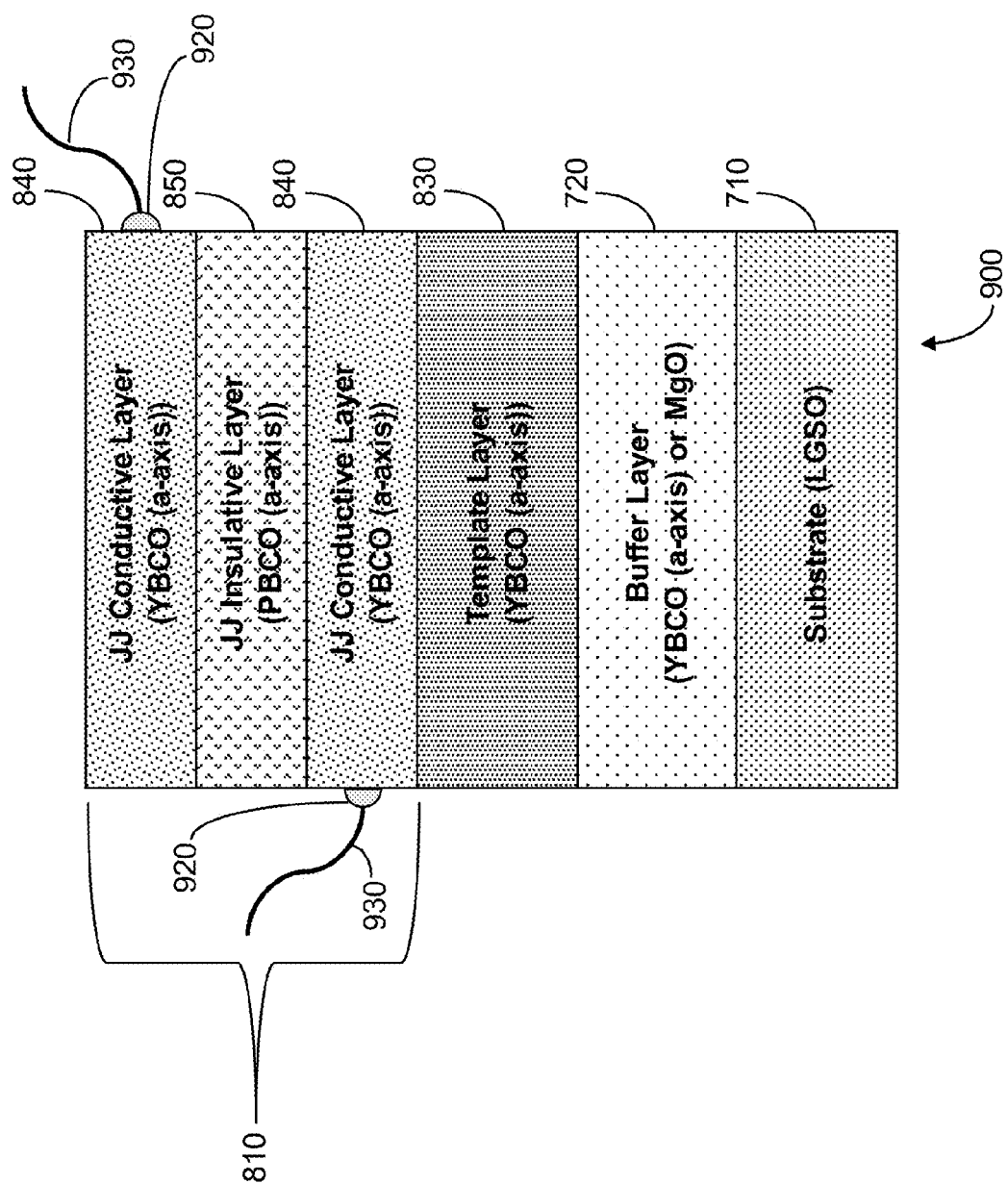
FIG. 9 illustrates a Josephson Junction device with electrical terminals coupled to the conductive layers according to various implementations of the invention.

FIG. 9 illustrates a JJ device 910 with electrical terminals 920 coupled to conductive layers 940 according to various implementations of the invention. As illustrated in FIG. 9, YBCO a-axis conductive layers 840 are grown on top of YBCO template layer 830. In some implementations of the invention, vertical JJ device 910 may be either dry or wet etched to create a mesa structure. Etching removes some of the top two layers to expose the lower conductive YBCO layer. Electrical contacts 920 may be made using ohmic metallization from e-beam evaporators that use silver or gold. Wire bonding of conductors 930 to electrical contacts 920 allow electrical stimulus to reach vertical JJ device 910 and on operation conduction occurs between two conductive layers 840 and across barrier region 850 (i.e., barrier layer).

While the invention has been described herein as using YBCO for the conductive layer(s), other perovskites may be used as would be appreciated.

What is claimed:
1. A Josephson Junction comprising:
a substrate layer adjacent to and configured to support a buffer layer, the substrate layer comprising SiC;
the buffer layer adjacent to and configured to support a template layer;

the template layer configured to orient subsequent adjacent layers in an a-axis orientation, wherein the template layer comprises LGSO or YBCO in the a-axis orientation;
a first conductive layer adjacent the template layer and oriented in the a-axis orientation, wherein the first conductive layer is YBCO in the a-axis orientation;
a barrier layer adjacent the first conductive layer; and
a second conductive layer adjacent the barrier layer and oriented in the a-axis orientation, wherein the second conductive layer is YBCO in the a-axis orientation;
wherein the template layer, the first conductive layer, the second conductive layer and the barrier layer are all formed via molecular beam epitaxy.

2. The Josephson Junction of claim 1, wherein the barrier layer comprises PBCO.

3. The Josephson Junction of claim 1, wherein the barrier layer comprises a perovskite.

4. The Josephson Junction of claim 1, wherein the buffer layer comprises AlN, MgO, or GaN.

5. The Josephson Junction of claim 1, wherein the buffer layer comprises YBCO in the a-axis orientation or MgO.

6. A Josephson Junction comprising:
a substrate layer adjacent to and configured to support a buffer layer, wherein the substrate layer comprises SiC;
the buffer layer adjacent to and configured to support a template layer, wherein the buffer layer comprises AlN, MgO, or GaN;
the template layer oriented in an a-axis orientation and configured to orient subsequent adjacent layers in the a-axis orientation, wherein the template layer comprises LGSO or YBCO;
a first conductive layer adjacent the template layer and oriented in the a-axis orientation, wherein the first conductive layer is YBCO;
a barrier layer adjacent the first conductive layer, wherein the barrier layer comprises PBCO; and
a second conductive layer adjacent the barrier layer and oriented in the a-axis orientation, wherein the second conductive layer is YBCO;
wherein the template layer, the first conductive layer, the second conductive layer and the barrier layer are all formed via molecular beam epitaxy.

* * * * *